(12) United States Patent
Alsayegh et al.

(10) Patent No.: US 11,567,017 B2
(45) Date of Patent: Jan. 31, 2023

(54) APPARATUS FOR MEASURING PERFORMANCE OF SUSPENSION FOR COOLING COMPUTER PROCESSING UNIT

(71) Applicant: KUWAIT INSTITUTE FOR SCIENTIFIC RESEARCH, Safat (KW)

(72) Inventors: Naser Alsayegh, Safat (KW); Ali Alsayegh, Safat (KW)

(73) Assignee: KUWAIT INSTITUTE FOR SCIENTIFIC RESEARCH, Safat (KW)

( * ) Notice: Subject to any disclaimer, the term of this patent is extended or adjusted under 35 U.S.C. 154(b) by 0 days.

(21) Appl. No.: 17/325,879

(22) Filed: May 20, 2021

(65) Prior Publication Data

US 2022/0373489 A1    Nov. 24, 2022

(51) Int. Cl.
*G01N 25/18*        (2006.01)
*H01L 23/473*       (2006.01)

(52) U.S. Cl.
CPC ............ *G01N 25/18* (2013.01); *H01L 23/473* (2013.01)

(58) Field of Classification Search
CPC ........ G01N 25/00; G01N 25/18; G01N 25/20; G01N 25/02; G01N 2011/002;
(Continued)

(56) References Cited

U.S. PATENT DOCUMENTS 3,200,638 A * 8/1965 De Haut ............ G01N 33/2888
73/53.05

3,968,677 A * 7/1976 Felton, Jr. .......... G01N 33/2805
374/57
(Continued)

FOREIGN PATENT DOCUMENTS

CN      111060340 A    4/2020
RU      2004129911 A   4/2006

OTHER PUBLICATIONS

A. Alfaryjat, L. Miron, H. Pop , V. Apostol, M. Stefanescu and A. Dobrovicescu, Experimental Investigation of Thermal and Pressure Performance in Computer Cooling Systems Using Different Types of Nanofluids, Aug. 29, 2019, Nanomaterials 2019 (Year: 2019).*

(Continued)

*Primary Examiner* — Christopher R Zerphey
*Assistant Examiner* — For K Ling
(74) *Attorney, Agent, or Firm* — Nath, Goldberg & Meyer; Richard C. Litman

(57) ABSTRACT

The apparatus for measuring performance of a suspension for cooling a computer processing unit is a measurement and testing tool allowing for the fabrication of new suspensions, and measuring and testing their short-term and long-term thermal performance in real time on any liquid-cooled computer processing unit. The suspension is prepared in a sample receiving reservoir and pumped across the unit, and then input to an air-cooled heat exchanger for recirculation back to the sample receiving reservoir. Temperatures of the working fluid are measured between the sample receiving reservoir and the computer processing unit, between the unit and the heat exchanger, and after output from the heat exchanger. Pressure differentials of the working fluid is measured across the computer processing unit and across the heat exchanger.

16 Claims, 4 Drawing Sheets

(58) Field of Classification Search
CPC ... G01N 2011/0093; G01N 2011/1062; G01N 2011/0046; G01N 1/286; G01N 1/38; G01N 33/2805; G01N 2035/00346; G01N 2035/00386; G06F 2119/08; G06F 1/206; F28F 2200/00; H01L 23/473; H05K 7/20281
USPC .............................................. 374/39, 40, 43
See application file for complete search history.

(56) References Cited

U.S. PATENT DOCUMENTS

| | | | | |
|---|---|---|---|---|
| 4,396,300 | A | * | 8/1983 | Characklis ............. G01N 25/18 374/43 |
| 4,563,097 | A | * | 1/1986 | Katafuchi .............. G01N 27/18 374/43 |
| 5,428,443 | A | * | 6/1995 | Kitamura ......... G01N 35/00594 356/336 |
| 5,439,288 | A | * | 8/1995 | Hoffman .................. G01N 1/38 366/127 |
| 9,630,155 | B2 | * | 4/2017 | Hotta .................... B01F 27/411 |
| 2002/0196835 | A1 | | 12/2002 | Schonath et al. |
| 2004/0000155 | A1 | * | 1/2004 | Cline ...................... F24F 3/065 62/175 |
| 2008/0029248 | A1 | * | 2/2008 | Magnant ................. F25D 23/00 165/104.19 |
| 2010/0236772 | A1 | * | 9/2010 | Novotny ............ H05K 7/20836 165/287 |
| 2013/0025818 | A1 | * | 1/2013 | Lyon .................. H05K 7/20781 165/181 |
| 2017/0074731 | A1 | * | 3/2017 | Santhanagopalan ... G01N 25/20 |
| 2017/0167938 | A1 | | 6/2017 | Plöchinger |
| 2017/0191765 | A1 | * | 7/2017 | Lee ....................... F28F 13/003 |

OTHER PUBLICATIONS

Praveen K. Namburu, Devdatta P. Kulkarni, Debasmita Misra and Debendra K. Das, Viscosity of copper oxide nanoparticles dispersed in ethylene glycol and water mixture, May 7, 2007, Experimental Thermal and Fluid Science 32 (2007), pp. 397-402 (Year: 2007).*

Alfaryjat et al., "Experimental Investigation of Thermal and Pressure Performance in Computer Cooling Systems Using Different Types of Nanofluids," Nanomaterials, 9, 1231, Aug. 29, 2019.

* cited by examiner

APPARATUS FOR MEASURING PERFORMANCE OF SUSPENSION FOR COOLING COMPUTER PROCESSING UNIT

BACKGROUND

1. Field

The disclosure of the present patent application relates to cooling integrated circuits, and particularly to an apparatus for measuring performance of a suspension for cooling a computer processing unit.

2. Description of the Related Art

There is great interest in enhancing the thermal performance of heat exchangers, particularly liquid-cooled heat exchangers (LC-HEs), such as those commonly used to cool central processing units (CPUs) of personal computers. Over the years, numerous approaches have been studied, such as through the modification of the geometry of the heat exchanger by adding external fins, inner turbulators and the like. Although these approaches have been quite successful in improving thermal transfer efficiency, it appears that little further improvement can be gained through changes solely to the heat exchange geometry. Thus, research has shifted towards improving the working fluids used in and with the heat exchangers.

Fluids of interest must necessarily have greater thermal transfer efficiencies than conventionally known fluids, and must also be operationally feasible. To meet these requirements, suspensions containing dispersed solid particles have become of great interest. Such suspensions include a hosting liquid (i.e., the "base fluid") with suspended solid particles on the order of micrometers or nanometers, resulting in so-called "microfluids" and "nanofluids", respectively. Since the thermal conductivity of the particles is at least an order of magnitude higher than the base fluid, dispersing the particles in the base fluid causes the overall (or "effective") thermal conductivity of the suspension to significantly increase.

In order for the suspension to reach optimal effective thermal conductivity, the particles must be homogenously dispersed in the base fluid, and must be maintained in physically stable condition. Meeting both requirements can be challenging, and there are a limited number of routes for the production of such suspensions. Primarily, either a one-step or a two-step approach may be used. In the one-step method, the particles are formed and dispersed in a single procedure, whereas in the two-step method, a dry powder is added to a base fluid, after which the particles and base fluid are mixed together using a dispersion device (e.g., an ultrasonicator, a homogenizer, magnetic stirring, etc.).

The one-step approach may result in a suspension having a higher dispersion physical stability, and also avoids the need to start with a dry powder, which can be difficult to handle and disperse, and must be both transported and stored. Despite these advantages, the one-step method also results in the production of unwanted residues due to incomplete reactions, and is also available for only a limited number of particle-base fluid combinations. For example, the one-step method cannot be used to produce a diamond-water suspension, since pure micro-diamonds and nano-diamonds can only be produced through chemical processes in the dry form.

The two-step method has the advantage that any combination of particles and non-dissolving base fluids can be used to produce the suspensions. Further, two-step methods are, in general, easier to perform and can be used for either mass or small size production. Additionally, the dry powders are typically widely commercially available. Due to these advantages, the two-step method is widely used by researchers in the field of advanced fluids. However, suspensions made by the two-step method have lower levels of dispersion physical stability than those created by the one-step method, although this can be improved through the addition of surfactants in the mixture at the fabrication stage, or by conducting surface functionalization on the particles.

A wide variety of different techniques are used to study the physical stability of such suspensions. Such approaches include the sedimentation photographical capturing method, dynamic light scattering (DLS), zeta potential analysis, the third harmonic method (i.e., the "3-$\omega$ method"), scanning electron microscopy (SEM) analysis, transmitted electron microscopy (TEM) characterization, spectral analysis, centrifugation, and particle size analysis. Out of all of these methods, only the use of a particle size analyzer can determine the physical stability of suspensions in their dynamic flow conditions, and these are the actual conditions any suspension would experience during real world applications. Unfortunately, particle size analysis has continuously been reported to overestimate the size of the dispersed particles, typically on the order of 2 to 10 nm greater than the actual size. Particle size analysis also occasionally overestimates the number of particles because the analyzer determines the particle's shadow to be an additional particle, in most cases. Thus, overall, the use of a particle size analyzer is unreliable for evaluating the physical dispersion stability of a suspension.

The 3-$\omega$ method, on the other hand, has been shown to be capable of determining the physical stability of dispersed particles through gradual changes in the effective thermal conductivity of the suspension. However, the presently used 3-$\omega$ physical stability evaluation approach deals with suspensions at their stationary shelving state. This is because the working fluid needs to be stationary to be able to measure the temperature difference ($\Delta T$) at a certain distance ($\Delta x$) and a given heat flux (q) for measuring the thermal conductivity (k) of a fluid. Fourier's law is used for measuring the thermal conductivity: $q = -k\ \Delta T/\Delta x$.

As discussed above, the presently used 3-$\omega$ method cannot reflect the actual working conditions that these fluids experience in real-world systems, i.e., in their flowing states. Thus, it would be desirable to be able to use an approach that is also based on measurable fluid characteristics to determine the efficiency and effectiveness of both nanofluid and microfluid suspensions in the dynamic flow state. The primary difficulty in applying the 3-$\omega$ method to this problem is that it focuses on the thermal conductivity as the primary suspension property being measured. It would be desirable to be able to focus instead on easily measurable fluid properties, such as temperature and pressure differences. It would also be desirable to be able to expand such a technique from an idealized set of laboratory conditions to the measurement and testing of real world working fluids, heat exchangers and LC-HEs used with CPUs. Thus, an apparatus for measuring performance of a suspension for cooling a computer processing unit solving the aforementioned problems is desired.

SUMMARY

The apparatus for measuring performance of a suspension for cooling a computer processing unit is a measurement and testing tool allowing for the fabrication of new heat exchanger working fluids, such as liquid suspensions containing dispersed solid particles, and measuring and testing their short-term and long-term thermal performance in real time on an integrated circuit heat source. As used herein, the term "computer processing unit may refer to a central processing unit (CPU), a graphics processing unit (GPU), a CPU chipset, a memory controller, or any other integrated circuit processor used in a computer that may require liquid cooling. For example, the performance of the heat exchanger working fluid may be tested on a computer having a liquid-cooled central processing unit (CPU).

The apparatus for testing the heat transfer performance of heat exchanger working fluids includes a sample receiving reservoir for receiving a sample of a working fluid. Preferably, the working fluid is a suspension created in the sample receiving reservoir by adding a base fluid and a powder to the reservoir and inserting the probe of an external homogenizer into the reservoir to mix the suspension. The reservoir is disposed in a water bath on top of a hot plate to control the temperature of the suspension when it is formed. This process avoids alteration of thermal properties when a suspension created elsewhere is transferred to the sample receiving reservoir.

A pump is in fluid communication with the sample receiving reservoir through a first conduit for driving a flow of the working fluid across an integrated circuit heat source. As discussed above, the heat source may be a central processing unit (CPU), graphics processing unit, or CPU chipset having a liquid-cooled heat exchange system, e.g. a metal integrated heat spreader (IHS) mounted on the processing unit and a water block mounted on the IHS with inlet and outlet conduits through the water block. A flow rate sensor is also provided in the first conduit for measuring the flow rate of the working fluid between the pump and the heat source.

A heat exchanger is in fluid communication with the water block mounted on the processing unit of the integrated circuit heat source for receiving a flow of a heated working fluid from the heat source, extracting thermal energy therefrom, and outputting a flow of a cooled working fluid. The flow of the cooled working fluid is then recirculated back to the sample receiving reservoir through a second conduit. The heat exchanger on the apparatus may be replaced by different heat exchangers to experimentally determine the most effective heat exchanger for cooling the suspension or working fluid.

A first temperature sensor measures the temperature of the flow of the working fluid between the pump and the integrated circuit heat source, and a second temperature sensor measures the temperature at the integrated circuit heat source. Additionally, a first pressure sensor measures the pressure differential of the flow of working fluid across the pump, and a second pressure sensor measures the pressure differential between the flow of the working fluid flowing to the integrated circuit heat source and the flow of the heated working fluid flowing away from the integrated circuit heat source.

A third temperature sensor measures the temperature of the flow of the heated working fluid, and a third pressure sensor measures the pressure differential between the flow of the heated working fluid entering the heat exchanger and the flow of the cooled working fluid output from the heat exchanger. The third temperature sensor measures the temperature of the flow of the heated working fluid between the heat source and the second pressure sensor. A fourth temperature sensor measures a temperature of the flow of the heated working fluid between the third pressure sensor and the heat exchanger, and a fifth temperature sensor measures the temperature of the cooled working fluid output from the heat exchanger.

Additionally, a sixth temperature sensor may be provided for measuring the temperature of the working fluid in the sample receiving reservoir, and an additional ambient temperature sensor (ATS) may be provided for measuring the temperature of the ambient environment.

In use, a base fluid and solid particles are added to the sample receiving reservoir. The probe of an external homogenizer is inserted into the reservoir to disperse the solid particles, adjusting the temperature of the water bath with a hot/cold plate as needed to facilitate formation of the suspension as the working fluid at a known temperature.

During testing, the flow rate of the working fluid may be adjusted by adjusting the power of the pump based on feedback provided by the flow rate sensor. The thermal performance on the heat source can be measured based on the temperature difference measured between the first and third temperature sensors, i.e., the temperature difference before and after passing across or through the liquid-cooled heat exchange system mounted on the integrated circuit. the level of heat generated by the CPU or other integrated circuit heat source can be adjusted by having the CPU running at different processing loads, e.g., the CPU may be utilized at 25%, 50%, 75%, or 100% of capacity. The thermal performance of the working fluid on the heat exchanger used to cool the working fluid can be measured based on the temperature difference measured between the fourth and fifth temperature sensors, i.e., the temperature difference before and after passing through the heat exchanger. Similarly, pressure losses in the working fluid can be measured across the integrated circuit heat source (by the second pressure sensor) and across the heat exchanger (by the third pressure sensor).

These and other features of the present disclosure will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

Figure 1:
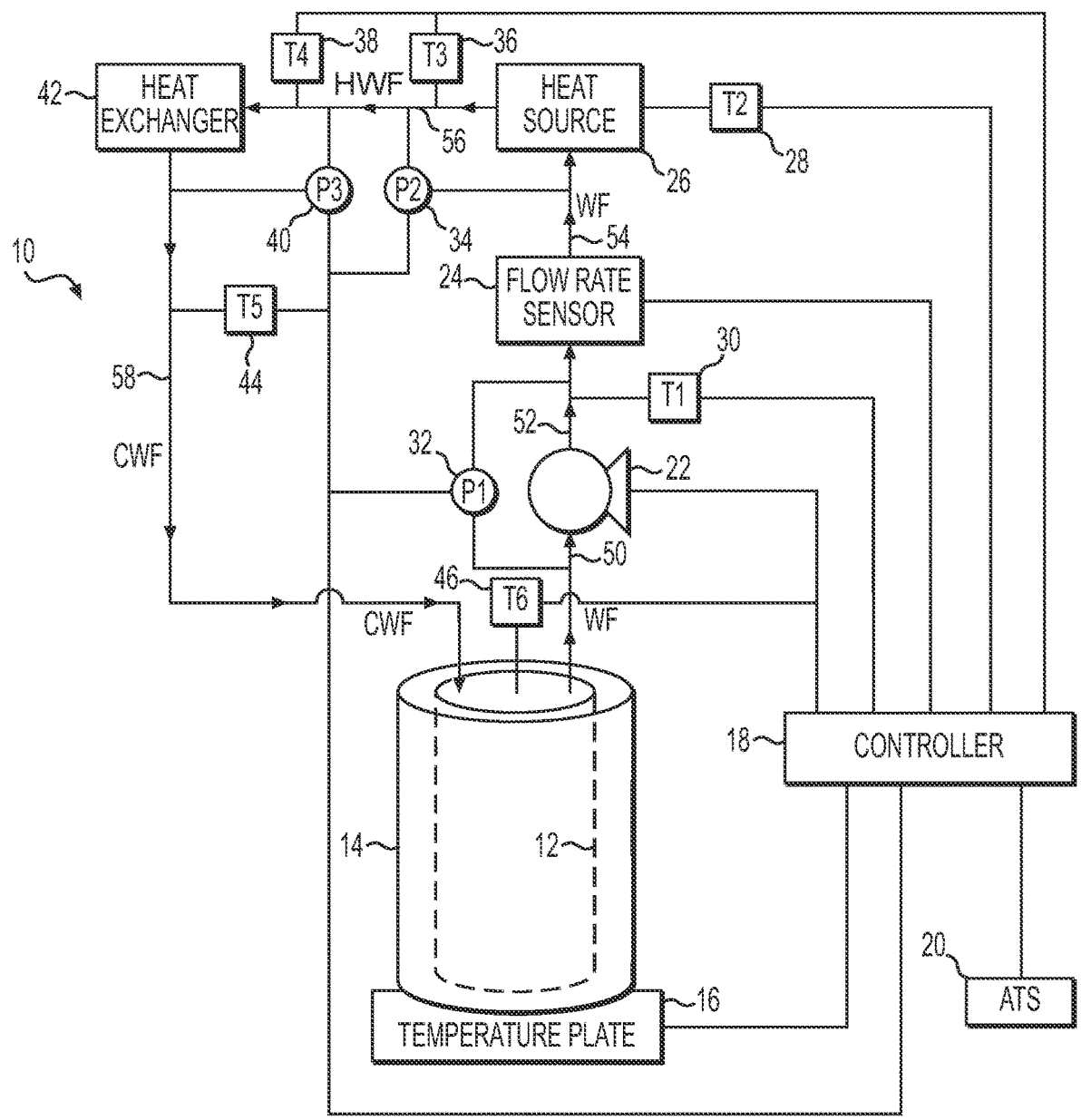
FIG. 1 is a schematic diagram of an apparatus for measuring performance of a suspension for cooling a computer processing unit.

The apparatus for measuring performance of a suspension for cooling a computer processing unit, designated generally as 10 in the drawings, is a measurement and testing tool allowing for the fabrication of new heat exchanger working fluids, such as liquid suspensions containing dispersed solid particles, and measuring and testing their short-term and long-term thermal performance in real time on any conventional integrated circuit heat source. For example, the performance of the heat exchanger working fluid may be tested on a computer having a liquid-cooled central processing unit (CPU), a graphics processing unit (GPU, a CPU chipset, a memory controller, or any other computer processor that may require liquid cooling, as will be discussed in greater detail below.

Referring now to FIG. 1, the apparatus for testing the heat transfer performance of heat exchanger working fluids 10 includes a sample receiving reservoir 12 for receiving a sample of a working fluid. As discussed above, the working fluid may be a liquid suspension containing dispersed solid particles. It should be understood that the overall relative dimensions and configuration of the sample receiving reservoir 12 are shown for exemplary purposes only. A pump 22 is in fluid communication with the sample receiving reservoir 12, through a first conduit 50, for driving flow of the working fluid WF across an integrated circuit heat source 26. A flow rate sensor 24 is also provided for measuring the flow rate of the working fluid WF between the pump 24 and the heat source 26. As shown, a pipe or tube 52 carries the pressurized working fluid WF from the pump 22 to the flow rate sensor 24, and another pipe or tube 54 carries the measured working fluid WF from the flow rate sensor 24 to the heat source 26. It should be understood that the pump 24 may be any suitable type of pump, and that the flow rate sensor 24 may be any suitable type of sensor or monitor for measuring the rate of flow of the working fluid WF following its pressurization by the pump 24.

Figure 4:
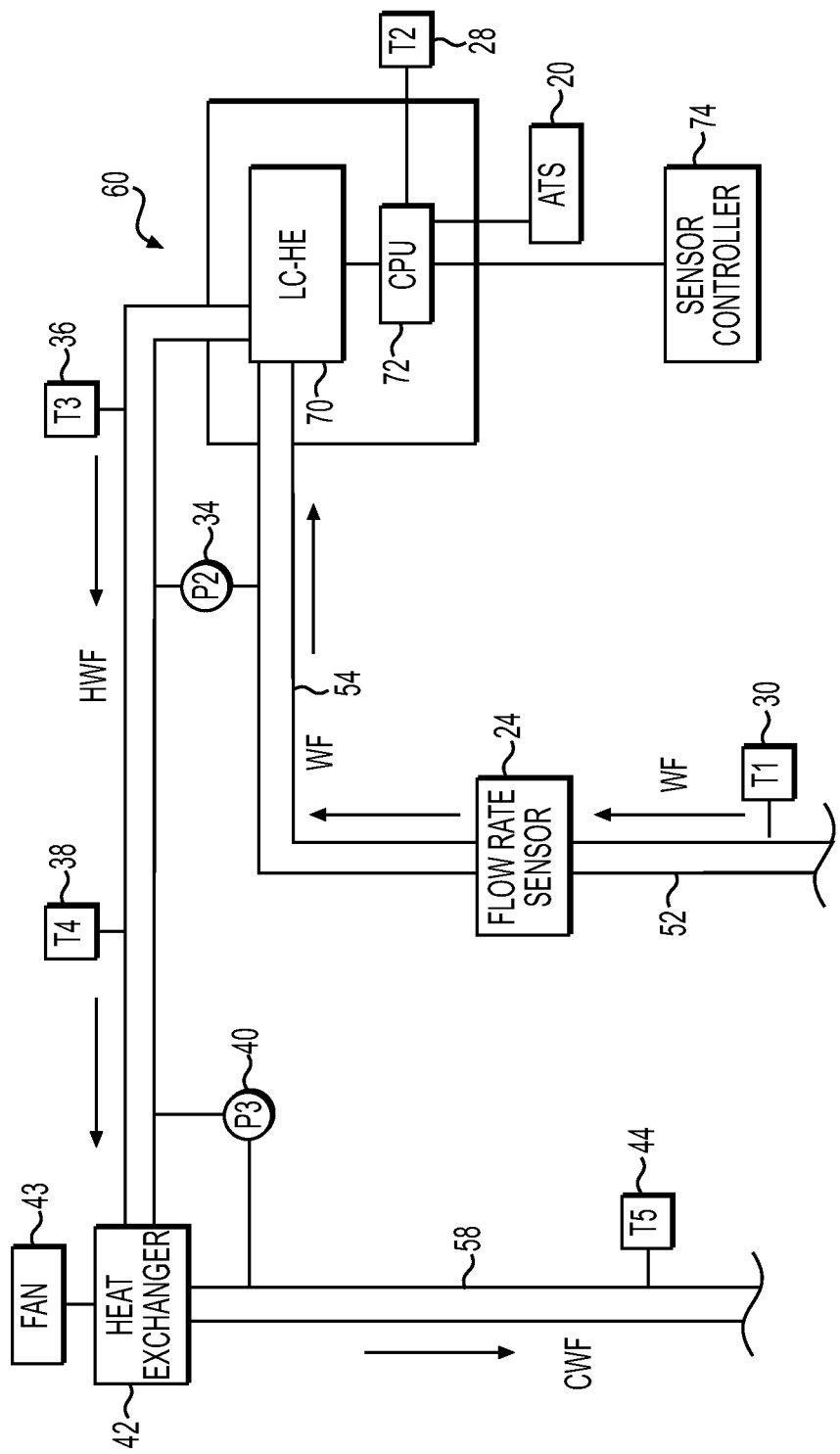
FIG. 4 is a schematic diagram further illustrating a portion of the diagram of FIG. 2.

A heat exchanger 42 is in fluid communication with the heat source 26 through a pipe or tube 56 for receiving a flow of a heated working fluid HWF from the heat exchange cooling system of the integrated circuit heat source 26, extracting thermal energy therefrom, and outputting a flow of cooled working fluid CWF. The flow of the cooled working fluid CWF is then recirculated back to the sample receiving reservoir 12 through a second conduit 58. It should be understood that heat exchanger 42 may be any suitable type of heat exchanger, but is preferably a pin and tube heat exchanger. As shown in FIG. 4, a fan 43 may be associated with heat exchanger 42, as is conventionally known, particularly for air-cooled or hybrid heat exchangers.

A first temperature sensor (T1) 30 measures the temperature of the flow of the working fluid WF between the pump 22 and the heat source 26, and a second temperature sensor (T2) 28 measures the temperature at the integrated circuit heat source 26. Additionally, a first pressure sensor (P1) 32 measures the pressure differential of the flow of the working fluid WF across the pump 22, and a second pressure sensor (P2) 34 measures the pressure differential between the flow of the working fluid WF flowing to the heat source 26 and the flow of the heated working fluid HWF flowing away from the heat source 26.

A third temperature sensor (T3) 36 measures the temperature of the flow of the heated working fluid HWF after passing through the integrated circuit's liquid cooling system, and a third pressure sensor (P3) 40 measures a pressure differential between the flow of the heated working fluid HWF entering the heat exchanger 42 and the flow of the cooled working fluid CWF output from the heat exchanger 42. The third temperature sensor 36 measures the temperature of the flow of the heated working fluid HWF between the heat source 26 and the second pressure sensor 34. A fourth temperature sensor (T4) 38 measures the temperature of the flow of the heated working fluid HWF between the third pressure sensor 40 and the heat exchanger 42, and a fifth temperature sensor (T5) 44 measures the temperature of the cooled working fluid CWF output from the heat exchanger 42 to determine the effectiveness of the heat exchanger 42 in cooling the suspension (the heat exchanger 42 on the apparatus 10 may be replaced by different heat exchangers to find the most effective heat exchanger for cooling the working fluid).

Additionally, a sixth temperature sensor (T6) 46 may be provided for measuring a temperature of the working fluid in the sample receiving reservoir 12 during creation of the suspension, and an additional ambient temperature sensor (ATS) 20 may be provided for measuring the temperature of the ambient environment. It should be understood that temperature sensors 20, 28, 30, 36, 38, 44, 46 may be any suitable type of temperature sensors, such as thermocouples or the like. Similarly, it should be understood that each of pressure sensors 32, 34, 40 may be any suitable type of pressure sensors, gauges or the like. As shown in FIG. 1, a controller 18 may be provided for communicating with each of temperature sensors 20, 28, 30, 36, 38, 44, 46, each of pressure sensors 32, 34, 40, pump 22, flow rate sensor 24, and atmospheric temperature sensor 20. It should be understood that the controller 18 may be any suitable type of controller, processor, programmable logic controller or the like or a personal computer for recording the sensed data and calculating performance of the working fluid based on the recorded data.

Figure 2:
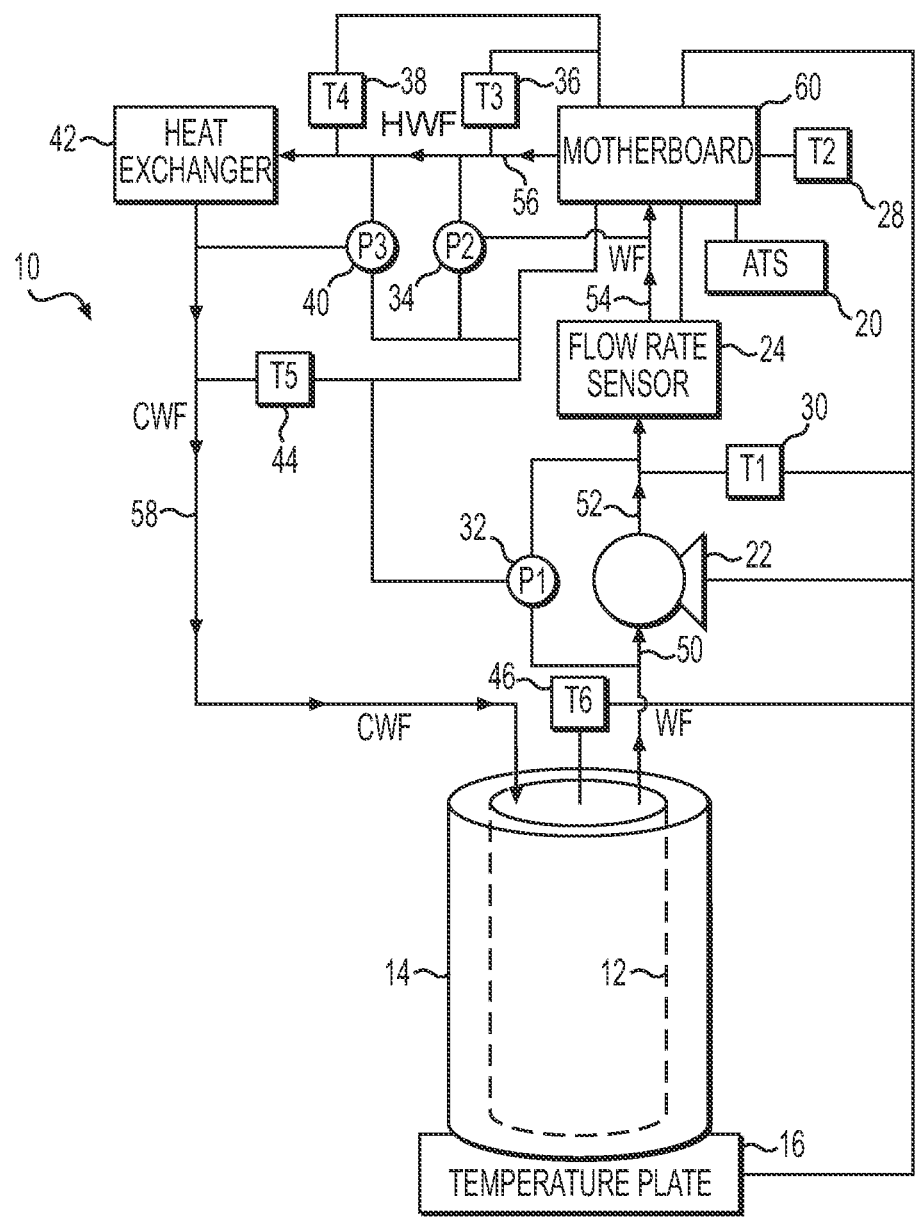
FIG. 2 is a schematic diagram further illustrating the apparatus for measuring performance of a suspension for cooling a computer processing unit.

As discussed above, for example, the heat source may be any computer processing unit requiring liquid cooling, such as a liquid-cooled central processing unit (CPU). In FIGS. 2 and 4, the generic heat source 26 has been expanded to show that the apparatus 10 has a generic computer motherboard 60 on which a CPU 72 that is cooled by a liquid-cooled heat exchanger 70 is mounted. The motherboard may provide RAM, ROM, device drivers, and other circuits to provide a load for the CPU 72 under test. In FIG. 2, no separate controller, such as controller 18 of FIG. 1, is shown. However, as shown in FIG. 4, an additional sensor controller 74, which may be a personal computer running software to test the effectiveness of the suspension in cooling the computer processing unit, assessing the effectiveness of the heat exchanger, and/or controlling temperature and pressure throughout the apparatus 10, is connected to the apparatus 10.

Figure 3:
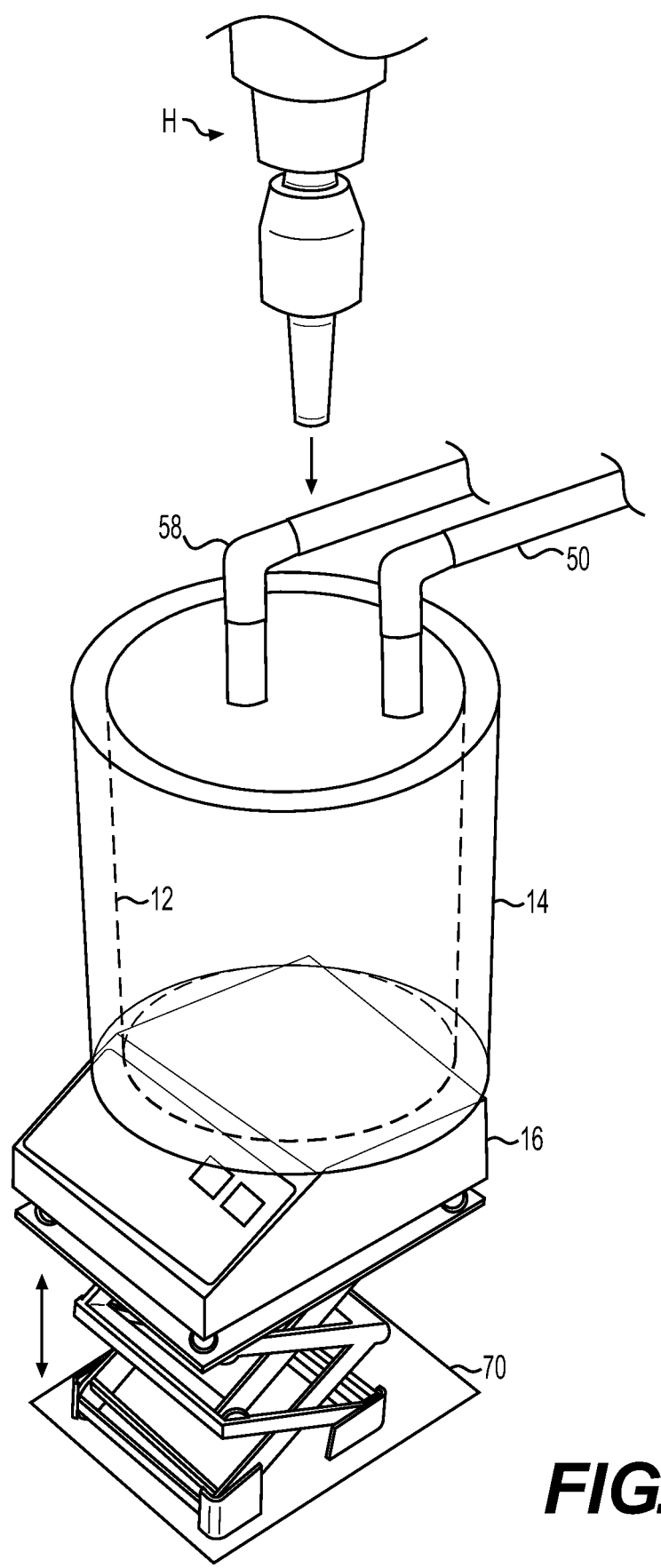
FIG. 3 is a partial perspective view of the apparatus for measuring performance of a suspension for cooling a computer processing unit, showing a height adjustable and temperature controllable sample receiving reservoir.

In use, the sample receiving reservoir 12 is initially at least partially filled with a sample of the working fluid WF. When the working fluid is a liquid suspension of dispersed solid particles, the suspension is created directly in the reservoir 12 by loading a base fluid into the reservoir and adding micro- or nano-sized particles to the base fluid. The probe of an external homogenizer H is inserted into the receiver and used to disperse the solid particles in the base fluid, homogenizing the working fluid sample within the sample receiving reservoir 12. The process of creating the suspension in the reservoir 12 avoids alteration in the thermal properties of the working fluid that may occur while transferring a working fluid formed elsewhere to the reservoir, e.g., due to additional mixing or other factors, thereby providing a more accurate assessment of the suspension's thermal properties. It should be understood that the conventional homogenizer H is shown in FIG. 3 for exemplary purposes only. The temperature of the sample receiving reservoir 12 may be adjusted using any conventional type of temperature controller 16, such as a temperature plate (i.e., a conventional laboratory hot/cold plate) or the like. The temperature controller 16 may also be in communication with controller 18 of FIG. 1. The sample receiving reservoir 12 may be disposed within a water bath 14 or the like, thus separating the sample receiving reservoir 12 from direct contact with the temperature plate 16. Control over the temperature allows for simulation of real world conditions. For example, the working fluid within the sample receiving reservoir 12 may be heated to a temperature of 20° C. to simulate common at-home temperatures, or may be heated to a temperature of 50° C. to simulate outside summer temperatures.

Additionally, as shown in FIG. 3, the height of the sample receiving reservoir 12, with respect to a base (e.g., the floor, a laboratory bench, etc.) or to the working table of the apparatus 10 may be adjusted as needed. It should be understood that the adjustable stand 70 is shown in FIG. 3 for exemplary purposes only, and that any suitable type of adjustable stand or the like may be used.

During testing, the flow rate of the working fluid may be adjusted by adjusting the power of the pump 22 based on feedback provided by the flow rate sensor 24. The central processing unit under test, such as CPU 72, is installed on the motherboard 60, and its attached liquid cooling heat exchanger system 70 is attached to the inlet conduit 54 and outlet conduit 56, respectively. The thermal performance of the suspension on the heat source 26 can be measured based on the temperature difference measured between the first and third temperature sensors 30, 36, respectively, i.e., the temperature difference before and after passing across or through the liquid cooling heat exchanger system 70. The CPU temperature can be adjusted by having the controller 18 control the CPU 72 to run under different processing loads, e.g., the CPU 72 may be utilized at 25%, 50%, 75%, 100%, etc. of the peak load. The thermal performance of the working fluid on the heat exchanger 42 can be measured based on the temperature difference measured between the fourth and fifth temperature sensors 38, 44, respectively, i.e., the temperature difference before and after passing through the heat exchanger 42, and experimentally adjusted for optimal cooling by substituting different heat exchangers for the default heat exchanger 42 furnished with the apparatus 10. Similarly, pressure losses in the working fluid can be measured across the heat source 26 (by the second pressure sensor 34) and across the heat exchanger 42 (by the third pressure sensor 40). It should be understood that the integrated circuit heat source 26 and the heat exchanger 42 may be replaced by any components that the user desires to test in addition to, or in conjunction with, the working fluid being tested.

Further, as discussed above, the apparatus for measuring performance of a suspension for cooling a computer processing unit 10 may be used for measuring and testing both the short-term and long-term thermal performance of working fluids. For example, in short-term testing, the apparatus f 10 may be run with a freshly-made working fluid suspension continuously for a relatively short duration, such as two minutes. For long-term testing, the apparatus f 10 may be run for a relatively long period of time, such as multiple days.

Since the heat exchanger working fluid may be prepared within the sample receiving reservoir 12, no additional mixing of the working fluid is required. Additional mixing would change the level of physical stability of dispersed particles within the working fluid suspension (and, thus, the thermophysical properties of the working fluid). Thus, such problems are avoided.

It is to be understood that the apparatus for measuring performance of a suspension for cooling a computer processing unit is not limited to the specific embodiments described above, but encompasses any and all embodiments within the scope of the generic language of the following claims enabled by the embodiments described herein, or otherwise shown in the drawings or described above in terms sufficient to enable one of ordinary skill in the art to make and use the claimed subject matter.

We claim:

1. An apparatus for measuring performance of an in situ prepared suspension for cooling a computer processing unit, comprising:
   a sample receiving reservoir for receiving a base fluid and solid particles;
   an externally attached homogenizer insertable into the sample receiving reservoir for dispersing the solid particles in the base fluid to form a sample of a working fluid in the sample receiving reservoir, wherein the sample of the working fluid comprises a suspension of the solid particles dispersed in the base fluid, the suspension being prepared within the sample receiving reservoir;
   a pump in fluid communication with the sample receiving reservoir for driving flow of the working fluid across a heat source, the heat source being a computer processing unit having a liquid-cooling heat exchange system mounted thereon;
   a heat exchanger in fluid communication with the liquid-cooling heat exchange system of the heat source for receiving flow of the working fluid heated while passing through the liquid-cooling heat exchange system of the heat source, extracting thermal energy therefrom, and outputting a flow of the working fluid after cooling, the flow of the cooled working fluid being recirculated back to the sample receiving reservoir;
   at least one conduit connecting the sample receiving reservoir, the pump, the liquid-cooling heat exchange system of the heat source, and the heat exchanger;
   a flow rate sensor in the at least one conduit between the pump and the heat source for measuring a flow rate of the working fluid between the pump and the heat source;
   a first temperature sensor disposed in the at least one conduit between the pump and the heat source for measuring temperature of the working fluid flowing between the pump and the heat source;
   a second temperature sensor at the heat source for measuring the temperature of the working fluid in the liquid-cooling heat exchange system of the heat source;
   a first pressure sensor connected across the pump for measuring a pressure differential of the working fluid across the pump;
   a second pressure sensor connected across the heat source for measuring the pressure differential between the flow of the working fluid flowing to the heat source and the flow of the heated working fluid flowing from the heat source;
   a third temperature sensor in the at least one conduit after the heat source for measuring the temperature of the working fluid after passing through the liquid-cooling heat exchange system of the heat source;
   a third pressure sensor connected across the heat exchanger for measuring the pressure differential between the flow of the working fluid entering the heat exchanger and the working fluid output from the heat exchanger;
   a fourth temperature sensor in the at least one conduit between the third pressure sensor and the heat exchanger for measuring the temperature of the working fluid between the third pressure sensor and the heat exchanger;
a fifth temperature sensor in the at least one conduit between the heat exchanger and the sample receiving reservoir for measuring the temperature of the working fluid output from the heat exchanger;
a sixth temperature sensor in the sample receiving reservoir for measuring the temperature of the working fluid in the sample receiving reservoir; and
a controller connected to each of said first, second, third, fourth, fifth and sixth temperature sensors and each of said first, second and third pressure sensors for monitoring performance of the suspension,
wherein the controller is configured to measure a thermal performance of the suspension on the heat source based on a temperature difference measured between the first and the third temperature sensors,
wherein the controller is further configured to measure the thermal performance of the suspension on the heat exchanger based on a temperature difference measured between the fourth and the fifth temperature sensors,
wherein the controller is further configured to measure a pressure drop of the suspension across the heat source based on the pressure differential measured by the second pressure sensor,
wherein the controller is further configured to measure a pressure drop of the suspension across the heat exchanger based on the pressure differential measured by the third pressure sensor, and
wherein the controller is further configured to adjust a power of the pump based on feedback from the flow rate sensor.

2. The apparatus for measuring performance as recited in claim 1, wherein the third temperature sensor is in the conduit between the heat source and the second pressure sensor.

3. The apparatus for measuring performance according to claim 1, wherein the computer processing unit is a liquid-cooled central processing unit.

4. The apparatus for measuring performance as recited in claim 1, further comprising an ambient temperature sensor connected to the apparatus for measuring temperature of the ambient environment.

5. The apparatus for measuring performance as recited in claim 1, further comprising:
a water bath, the sample receiving reservoir being partially submerged in the water bath; and
a temperature plate, the water bath being disposed on top of the temperature plate, wherein the temperature plate selectively heats and cools the water bath.

6. The apparatus for measuring performance as recited in claim 5, wherein the temperature plate is in communication with the controller.

7. The apparatus for measuring performance as recited in claim 1, further comprising a motherboard, the computer processing unit having the liquid-cooling heat exchange system mounted thereon being attached to the motherboard during testing to provide a load for the computer processing unit.

8. The apparatus for measuring performance as recited in claim 1, wherein said heat exchanger is replaceable in order to experimentally determine an optimal heat exchanger for cooling the suspension.

9. A method for measuring performance of a suspension for cooling a computer processing unit, comprising the steps of:

attaching a computer processing unit to be tested to a motherboard, the computer processing unit having a liquid cooling heat exchanger system mounted thereon;
preparing the suspension in a sample receiving reservoir by inserting an externally attached homogenizer into the sample receiving reservoir for dispersing solid particles in a base fluid to form a sample of a working fluid in the sample receiving reservoir, wherein the sample of the working fluid comprises the suspension;
pumping the suspension from the sample receiving reservoir through the liquid cooling heat exchanger system mounted on the computer processing unit using a pump;
measuring a flow rate of the suspension between the pump and the liquid cooling heat exchanger system mounted on the computer processing unit using a flow rate sensor;
after passing through the liquid cooling heat exchanger system mounted on the computer processing unit, cooling the suspension in an air-cooled heat exchanger;
measuring a temperature of the suspension before and after passing through the liquid cooling heat exchanger system mounted on the computer processing unit to determine heat absorption capacity of the suspension for absorbing heat generated by the computer processing unit, a temperature of the suspension between the pump and the liquid cooling heat exchanger system being measured by a first temperature sensor and a temperature of the suspension at the liquid cooling heat exchanger system being measured by a second temperature sensor;
measuring a pressure differential of the suspension across the pump using a first pressure sensor;
measuring a pressure drop of the suspension across the computer processing unit using a second pressure sensor;
measuring a pressure drop of the suspension across the air-cooled heat exchanger using a third pressure sensor;
measuring a temperature of the suspension before and after passing through the air-cooled heat exchanger to determine performance of the air-cooled heat exchanger in cooling the suspension, wherein a temperature of the suspension after passing through the liquid cooling heat exchanger system is measured by a third temperature sensor, wherein a temperature of the suspension between the third pressure sensor and the air-cooled heat exchanger is measured by a fourth temperature sensor, and wherein a temperature of the suspension between the air-cooled heat exchanger and the sample receiving reservoir is measured by a fifth temperature sensor;
recirculating the cooled suspension back to the sample receiving reservoir;
measuring a temperature of the suspension in the sample receiving reservoir using a sixth temperature sensor;
determining a thermal performance of the suspension on the computer processing unit based on a temperature difference measured between the first and the third temperature sensors;
determining a thermal performance of the suspension on the air-cooled heat exchanger based on a temperature difference measured between the fourth and the fifth temperature sensors; and
adjusting a power of the pump based on feedback from the flow rate sensor.

10. An apparatus for measuring performance of an in situ prepared suspension for cooling a computer processing unit, comprising:
- a sample receiving reservoir for receiving a base fluid and solid particles;
- an externally attached homogenizer insertable into the sample receiving reservoir for dispersing the solid particles in the base fluid to form a sample of a working fluid in the sample receiving reservoir, wherein the sample of the working fluid comprises a suspension of the solid particles dispersed in the base fluid, the suspension being prepared within the sample receiving reservoir;
- a pump in fluid communication with the sample receiving reservoir for driving flow of the working fluid across a heat source, the heat source being a computer processing unit having a liquid-cooling heat exchange system mounted thereon;
- a heat exchanger in fluid communication with the liquid-cooling heat exchange system of the heat source for receiving flow of the working fluid heated while passing through the liquid-cooling heat exchange system of the heat source, extracting thermal energy therefrom, and outputting a flow of the working fluid after cooling, the flow of the cooled working fluid being recirculated back to the sample receiving reservoir;
- at least one conduit connecting the sample receiving reservoir, the pump, the liquid-cooling heat exchange system of the heat source, and the heat exchanger;
- a flow rate sensor in the at least one conduit between the pump and the heat source for measuring a flow rate of the working fluid between the pump and the heat source;
- a first temperature sensor disposed in the at least one conduit between the pump and the heat source for measuring temperature of the working fluid flowing between the pump and the heat source;
- a second temperature sensor at the heat source for measuring the temperature of the working fluid in the liquid-cooling heat exchange system of the heat source;
- a first pressure sensor connected across the pump for measuring a pressure differential of the working fluid across the pump;
- a second pressure sensor connected across the heat source for measuring the pressure differential between the flow of the working fluid flowing to the heat source and the flow of the heated working fluid flowing from the heat source;
- a third temperature sensor in the at least one conduit after the heat source for measuring the temperature of the working fluid after passing through the liquid-cooling heat exchange system of the heat source;
- a third pressure sensor connected across the heat exchanger for measuring the pressure differential between the flow of the working fluid entering the heat exchanger and the working fluid output from the heat exchanger;
- a fourth temperature sensor in the at least one conduit between the third pressure sensor and the heat exchanger for measuring the temperature of the working fluid between the third pressure sensor and the heat exchanger;
- a fifth temperature sensor in the at least one conduit between the heat exchanger and the sample receiving reservoir for measuring the temperature of the working fluid output from the heat exchanger; and
- a controller connected to each of said first, second, third, fourth and fifth temperature sensors and each of said first, second and third pressure sensors for monitoring performance of the suspension, wherein the controller comprises the computer processing unit being cooled by the in situ prepared suspension whose performance is being measured,
- wherein the controller is configured to measure a thermal performance of the suspension on the heat source based on a temperature difference measured between the first and the third temperature sensors,
- wherein the controller is further configured to measure the thermal performance of the suspension on the heat exchanger based on a temperature difference measured between the fourth and the fifth temperature sensors,
- wherein the controller is further configured to measure a pressure drop of the suspension across the heat source based on the pressure differential measured by the second pressure sensor,
- wherein the controller is further configured to measure a pressure drop of the suspension across the heat exchanger based on the pressure differential measured by the third pressure sensor, and
- wherein the controller is further configured to adjust a power of the pump based on feedback from the flow rate sensor.

11. The apparatus for measuring performance as recited in claim 10, further comprising a sixth temperature sensor in the sample receiving reservoir for measuring the temperature of the working fluid in the sample receiving reservoir, the sixth temperature sensor being connected to the controller.

12. The apparatus for measuring performance as recited in claim 10, further comprising:
- a water bath, the sample receiving reservoir being partially submerged in the water bath; and
- a temperature plate, the water bath being disposed on top of the temperature plate, wherein the temperature plate selectively heats and cools the water bath.

13. The apparatus for measuring performance as recited in claim 12, wherein the temperature plate is in communication with the controller.

14. The apparatus for measuring performance as recited in claim 10, wherein the third temperature sensor is in the conduit between the heat source and the second pressure sensor.

15. The apparatus for measuring performance as recited in claim 10, further comprising an ambient temperature sensor connected to the apparatus for measuring temperature of the ambient environment.

16. The apparatus for measuring performance as recited in claim 10, wherein the controller is further configured to adjust a temperature of the computer processing unit by adjusting a processor load thereof.

* * * * *